United States Patent
Hsueh et al.

(10) Patent No.: US 6,275,591 B1
(45) Date of Patent: *Aug. 14, 2001

(54) METHOD AND APPARATUS FOR EXTRACTING A COMPONENT SIGNAL FROM A COMPOSITE SIGNAL

(75) Inventors: Keng D. Hsueh, West Bloomfield; Garland Lee, Dearborn; Larry Duane Hollingsworth, Farmington Hills, all of MI (US); Christopher Robert Fuller, Virginia Beach, VA (US); Jerome Peter Smith, Blacksburg, VA (US); Julien Maillard, Blacksburg, VA (US); Ricardo Anibal Burdisso, Blacksburg, VA (US)

(73) Assignee: Ford Global Technologies, Inc., Dearborn, MI (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/734,939

(22) Filed: Oct. 22, 1996

(51) Int. Cl.$^7$ .......................... A61F 11/06; G10K 11/16; H03B 29/00
(52) U.S. Cl. ....................... 381/71.11; 381/71.8
(58) Field of Search ............... 381/71, 94, 73.1, 381/86, 91.4, 71.1, 71.2, 71.4, 71.8, 71.11, 71.12, 71.13; 364/724.19; 375/232, 233; 333/165, 166, 18

(56) References Cited

U.S. PATENT DOCUMENTS

| | | |
|---|---|---|
| 4,122,432 | 10/1978 | Triebold et al. . |
| 4,429,578 | 2/1984 | Darrel et al. . |
| 4,750,147 | 6/1988 | Roy, III et al. . |
| 4,965,732 | 10/1990 | Roy, III et al. . |
| 5,119,432 | 6/1992 | Hirsch . |
| 5,201,292 | 4/1993 | Grajski et al. . |
| 5,245,589 | 9/1993 | Abel et al. . |
| 5,255,565 | 10/1993 | Judd et al. . |
| 5,270,950 | 12/1993 | Cowley et al. . |
| 5,410,604 | 4/1995 | Saito et al. . |
| 5,419,198 | 5/1995 | Pla . |
| 5,430,690 | 7/1995 | Abel . |
| 5,434,783 | 7/1995 | Pal et al. . |
| 5,511,008 | 4/1996 | Flament et al. . |
| 5,528,557 | 6/1996 | Horn . |
| 5,535,131 | 7/1996 | Sanders . |
| 5,727,073 | * 3/1998 | Ikeda ................................. 381/94.7 |

OTHER PUBLICATIONS

Widrow, Bernard and Stearns, Samuel. "Adaptive Signal Processing", Prentice–Hall, Inc. pp. 99–100, Jan. 1985*

* cited by examiner

Primary Examiner—Minsun Oh Harvey
(74) Attorney, Agent, or Firm—Mark L. Mollon; William J. Coughlin

(57) ABSTRACT

An extracting assembly for extracting a component signal generated by a component source from a composite signal is disclosed wherein a reference sensor generates a reference signal relating to activity of the component source, a composite sensor senses the composite signal, an adaptive filter is operatively connected to the reference sensor and the composite sensor to filter the component signal from the composite signal as a function of the reference signal generated by the reference sensor, and a normalizer operatively connected to the adaptive filter for normalizing the step size of each iteration taken by the adaptive filter to minimize the time to adapt the adaptive filter to transform the reference signal into the component signal.

6 Claims, 4 Drawing Sheets

METHOD AND APPARATUS FOR EXTRACTING A COMPONENT SIGNAL FROM A COMPOSITE SIGNAL

BACKGROUND OF THE INVENTION

1. Field of the Invention

The present invention relates generally to extracting component signals from a composite signal and, more specifically, to a method and assembly for extracting and identifying component signals from their responsive sources.

2. Description of the Related Art

There are many instances when it is desirable to analyze a signal. This is especially true in the automotive field when determining how much noise is going to be heard by the occupants of a motor vehicle. Depending on the level of noise, it is often a desire to reduce the noise to provide a motor vehicle with quiet operating characteristics.

Eliminating noise can best be accomplished by eliminating the source of the noise. Because noise, especially in motor vehicles, is a composite of many different noises, the source is often difficult to identify. Noise in motor vehicles is generated by its powertrain, the interaction between the road and the tire, and the wind it creates and drives through. These three types of noise have different characteristics and are, often times, random because they depend on so many variables which are also random. For example, the overall noise at a specific speed may have a substantially different characteristic if the powertrain is providing a substantial torque at that speed. Likewise, the overall noise may be affected by the condition of the road on which the motor vehicle is traveling. Therefore, there is a need to isolate the sources of the overall noise under various vehicle operating conditions to best eliminate it.

U.S. Pat. No. 5,419,198 to Pla discloses an electronic signal enhancement and separation assembly for machinery diagnostics. This assembly utilizes a sensor at each noise generator, namely a rotating shaft. In the embodiments contemplated by Pla, all of the noise generators were rotating shafts. The signals generated by the sensors were fed through an adaptive filter which modified itself based on the activity of the noise generator. This adaption allows the filters to more accurately identify the portion of the noise generated by each individual rotating shaft. This assembly only senses rotating objects, i.e., rotating shafts. Therefore, its usefulness is limited when used in an environment such as a motor vehicle. Although useful in detecting noise generated by a driveshaft, noise generated in a motor vehicle by other sources is random and an assembly that is capable of sensing periodic noise having a very small random component is not useful due to the time it takes to adapt to the randomness of the noise. More specifically, by the time the assembly adapts its filter to the noise in the motor vehicle, the motor vehicle will be in another condition generating a different type of noise for which the filter cannot adapt quickly enough. Therefore, there exists a need to adapt a filter quickly to react to the randomness of the signal it is filtering while accurately extracting the component of the noise signal for which it is designed.

SUMMARY OF THE INVENTION

Accordingly, an extracting assembly for extracting a component signal generated by a component source from a composite signal is disclosed. The extracting assembly includes a reference sensor that generates a reference signal relating to activity of the component source. A composite sensor senses the composite signal. An adaptive filter is operatively connected to the reference sensor and the composite sensor. The adaptive filter filters the component signal from the composite signal as a function of the reference signal generated by the reference sensor. A normalizer operatively connected to the adaptive filter normalizes the step size of each iteration taken by the adaptive filter to minimize the time to adapt the adaptive filter to transform the reference signal into the component signal.

One advantage associated with the present invention is the ability to adaptively filter a component signal and to extract same out of a composite signal. A second advantage associated with the present invention is the ability to adapt a filter in real time. Another advantage associated with the present invention is the ability to adapt a filter in real time in a rapidly changing environment. Still another advantage associated with the present invention is the ability to analyze components of a signal by filtering them out of the signal in the time domain rather than in the frequency domain.

Other advantages and features of the present invention will be readily appreciated as the same becomes better understood by reference to the subsequent description when considered in connection with the accompanying drawings.

DESCRIPTION OF THE PREFERRED EMBODIMENT(S)

Figure 1:
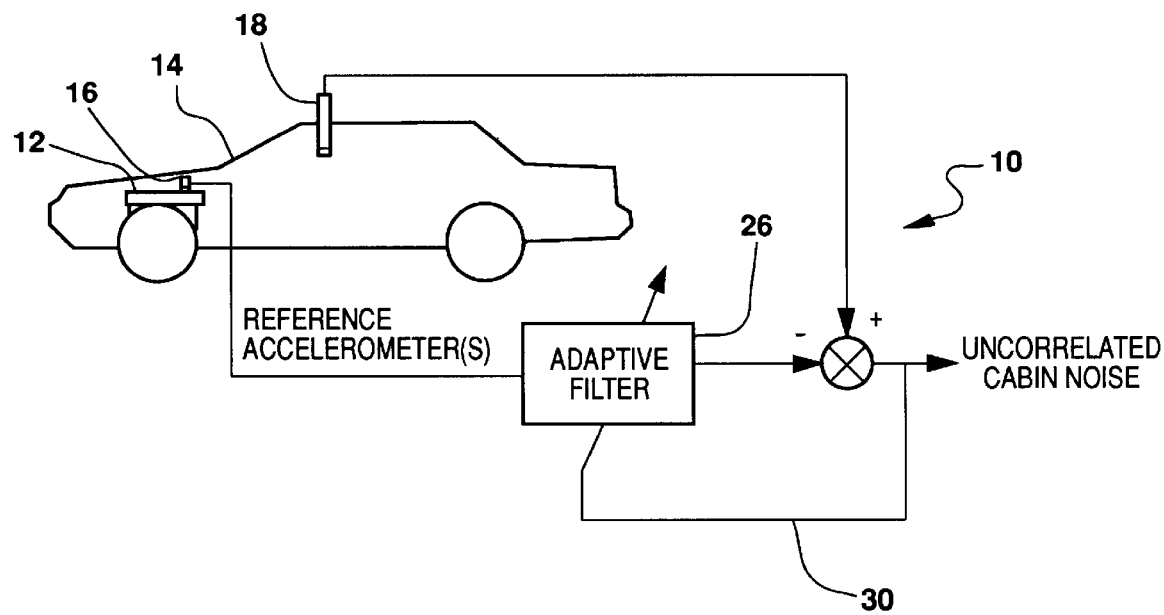
FIG. 1 is a block diagram of one embodiment of the present invention.
Figure 3:
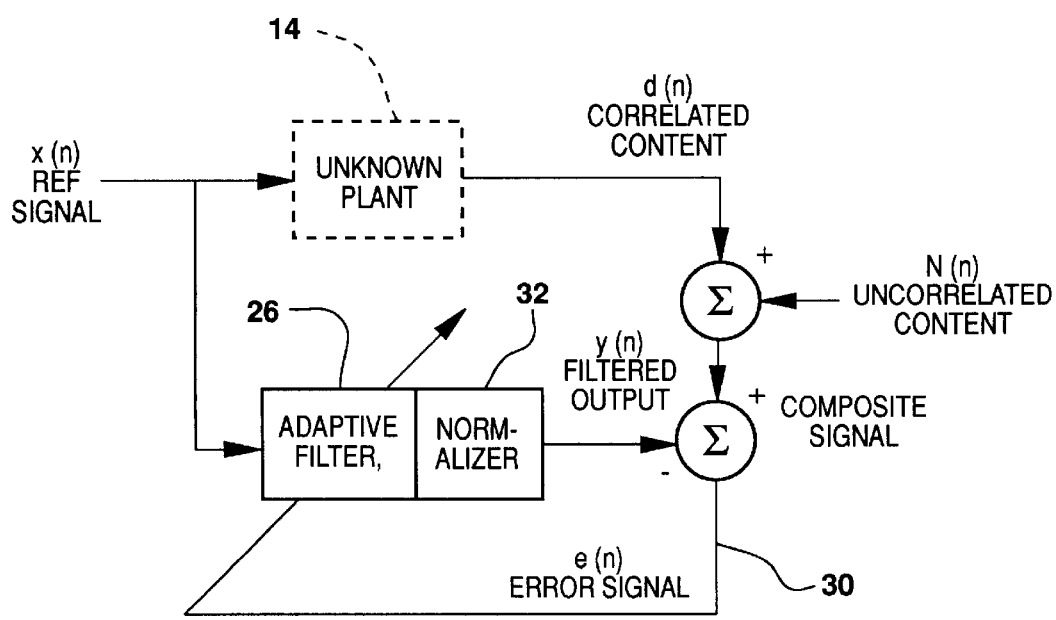
FIG. 3 is a block schematic diagram of the one embodiment of the present invention.
Figure 2:
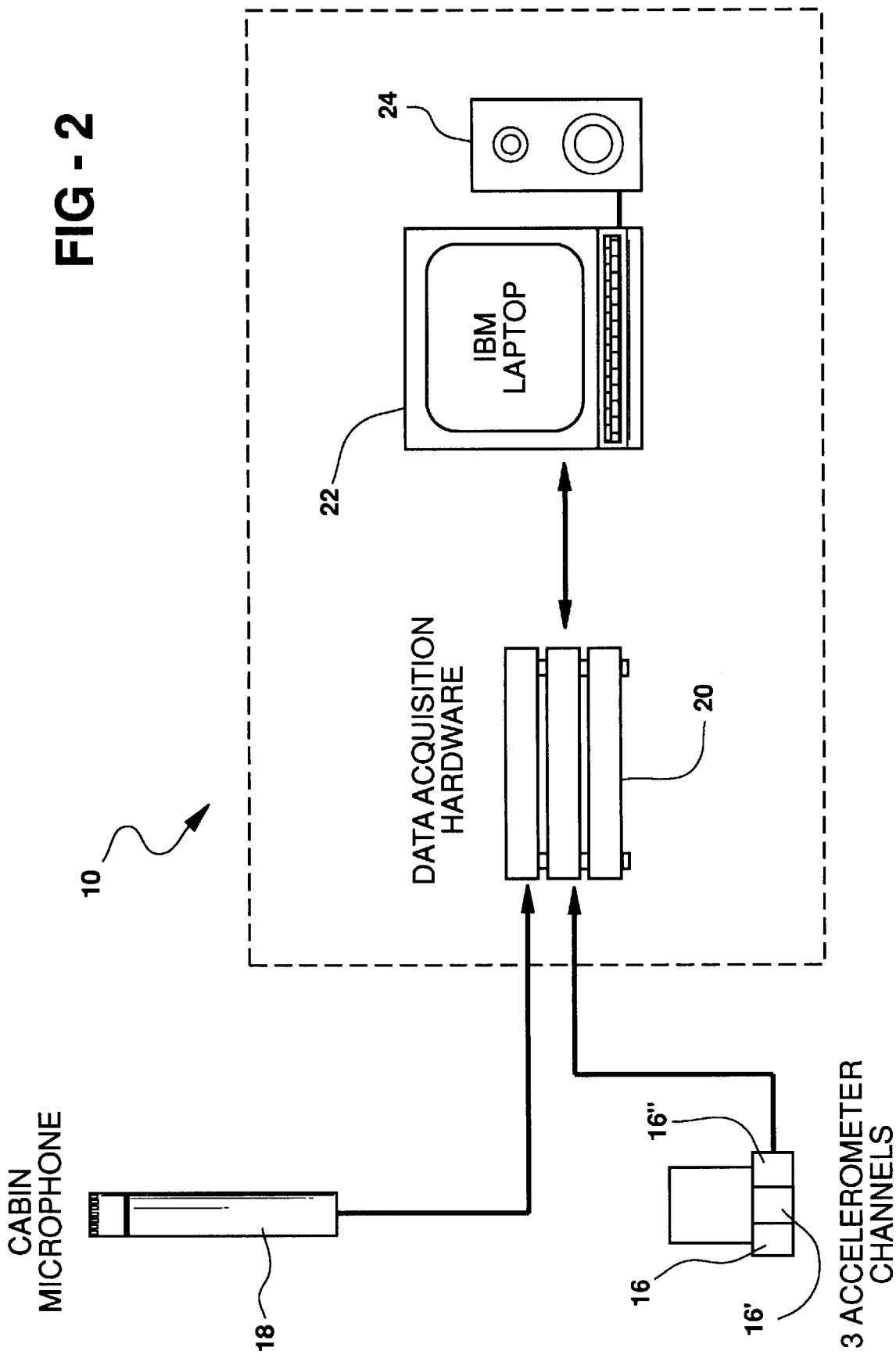
FIG. 2 is a block diagram of another embodiment of the present invention.

Referring FIGS. 1 and 2, the present invention, an extracting assembly, is generally indicated at 10. The extracting assembly 10 extracts a component signal generated by a component source 12 from a composite signal (the signals will be discussed subsequently). In one embodiment, the component source 12 may be a powertrain of a motor vehicle 14. Other examples of the component source 12 may include a road (not shown) upon which the motor vehicle 14 is driving or the wind (not shown) generated by or through which the motor vehicle 14 is passing. These examples are used to show a component source 12 are not exhaustive as there may exist other component sources 12 which may generate noise or vibration which can be characterized by a component signal. Further, the extracting assembly 10 may be used in environments other than a motor vehicle 14.

The extracting assembly 10 includes a reference sensor 16. The reference sensor 16 generates a reference signal relating to activity of the component source 12, i.e., the powertrain in FIG. 1. The reference sensor 16 may be a microphone or other such sensor. In the embodiments shown in FIGS. 1 and 2, the reference sensor 16 is an accelerometer. The reference signal may be represented by a set of coefficients in vector form as follows:

$$\{X(n)\} = [x(n) \times (n-1) \ldots x(n-1)]^T. \tag{1}$$

wherein l is the number of coefficients needed to accurately describe the reference signal.

As may be seen in FIG. 2, the extracting assembly 10 may include a plurality of reference sensors 16, 16', 16" for such component sources 12 as powertrain, road excitation, and wind excitation. The number of reference sensors used in the present invention is limited only by the number of detectable signals and the hardware available. The remainder of the discussion will only include a discussion of a single reference sensor 16 unless otherwise explicitly noted.

A composite sensor 18 senses the composite signal. In the embodiments shown in the Figs., the composite sensor 18 is a microphone used to sense all of the audible noise propagating through an occupant compartment (not shown) of the motor vehicle 14. The composite sensor 18 does not discern between frequencies and amplitudes other than it may not transform noise outside the audible range into a component of the composite signal.

Data acquisition hardware 20 (best seen in FIG. 2) is used to collect the signals generated by the reference sensor 16 and the composite sensor 18. The data acquisition hardware 20 stores the signals and transmits the signals to a data processor 22, a lap top computer. A lap top computer 22 is used in one embodiment because it can be easily transported and operated in the occupant compartment of the motor vehicle 14. It may be appreciated by those skilled in the art that a similar device or dedicated hardware components may be designed and used without deviating from the inventive concept. The lap top computer 22 includes a speaker 24 electrically connected thereto so that the lap top computer 22 may output, through the speaker 24, either the component signal or the composite signal.

An adaptive filter 26 is operatively connected to the composite sensor 18 and the reference sensor 16. The adaptive filter 26 filters the component signal from the composite signal as a function of the reference signal generated by the reference sensor. More specifically, the adaptive filter 26 is capable of determining, or transforming, based on the reference signal received from the reference sensor 16, what component of the composite signal, generated by the composite sensor 18, is due to the component source 12 of the noise after the adaptive filter 26 has converged.

The adaptive filter 26 utilizes a least-mean-square algorithm to adapt itself. The adaptive filter 26 can be characterized by a plurality of finite impulse response coefficients as members of a vector:

$$\{W(n)\}=[w_0 w_1 w_2 \ldots w_l]^T. \tag{2}$$

A feedback adaptation loop 30 is operatively connected to the adaptive filter 26 and the composite sensor 18. The feedback adaptation loop 30 generates a signal which is the addition of the portion of the composite signal associated with the reference signal and the composite signal and the uncorrelated content of the composite signal N(n). This sumless the filtered representation of the reference signal, $x^T W$, becomes the feedback adaptation or error signal. The error signal is represented by:

$$e(n)=d(n)+N(n)-\{X(n)\}^T\{W(n-1)\} \tag{3}$$

wherein d(n) is the portion of the composite signal correlated to the activity of the component source 12 as recorded or transmitted by the reference sensor 16. N(n) is the portion of the composite signal uncorrelated with the activity of the component source 12 as recorded or transmitted by the reference sensor 16. The component signal d(n) is the noise which has been correlated to the activity of the source 12. The component signal is not identical to the reference signal because the component signal is what results after the signal, a reference signal or otherwise, is passed through an unknown plant, namely the motor vehicle 14 as it reacts to the conditions in which it is operated.

The adaptive filter 26 is updated in real time in order to insure the most accurate separation of the component signal, d(n), from the composite signal received by the composite sensor 18. Alternatively, the adaptive filter 26 may be used to filter recorded signals for post-processing. According to the least-mean-square algorithm, the adaptive filter 26 is updated according to the following equation:

$$\{W(n)\}=\{W(n-1)\}+2\,\mu e(n)\{X(n)\}. \tag{4}$$

$\mu$ is an adaptation coefficient used for convergence or stability whose parameters are defined by:

$$0<\mu<\frac{1}{(l+1)E[x^2(n)]}. \tag{5}$$

wherein E is an expected value of the component signal.

Stability refers to the ability of the adaptive filter to converge to the desired set of filter coefficients. This set of filter coefficients satisfies a selected value of e(n). It is also desirable to minimize the steps taken by the adaptive filter 26 in order to insure it adapts in real time in a manner such that it will be useful in a highly dynamic environment such as one found in a motor vehicle 14. If these steps are too small, the adaptive filter 26 will not adapt as quickly as it needs to insure its usefulness in the environment for which it is to operate. The adaptive filter 26 may overshoot or not converge at all if it is not stable.

To insure proper convergence of the adaptive filter 26 onto the component signal, the adaptive filter 26 includes a normalizer 32. In alternative embodiments not shown, the normalizer 32 may be operatively connected to the adaptive filter 26. The normalizer 32 normalizes a stability factor $\mu$ to minimize the time it takes to adapt the adaptive filter 26 to the reference signal and the composite signal and still guarantee stability. The stability factor $\mu$ is a coefficient which affects the step size taken during each iteration the adaptive filter 26 executes. The normalizer 32 operates on $\mu$ per the following equation:

$$\mu(n)=\frac{\mu_0}{\{X(n)\}^T\{X(n)\}}, \quad \mu_0<1. \tag{6}$$

Note that if l is large enough:

$$\{X(n)\}^T\{X(n)\}=(1+l)E[x^2(n)]. \tag{7}$$

$\mu_0$, a predetermined size, is usually estimated as 0.1.

The feedback adaptation loop 30 is functional only so long as the adaptive filter 26 is converging on the component signal. A cost function, J, identifies when additional changes in the filter coefficients are not worth further modifying. This function follows the relationship set forth in equation 8 below:

$$J=E[e^2(n)]. \tag{8}$$

$e^2$ is a paraboloid the minimum of which identifies where the error is minimized.

Figure 4:
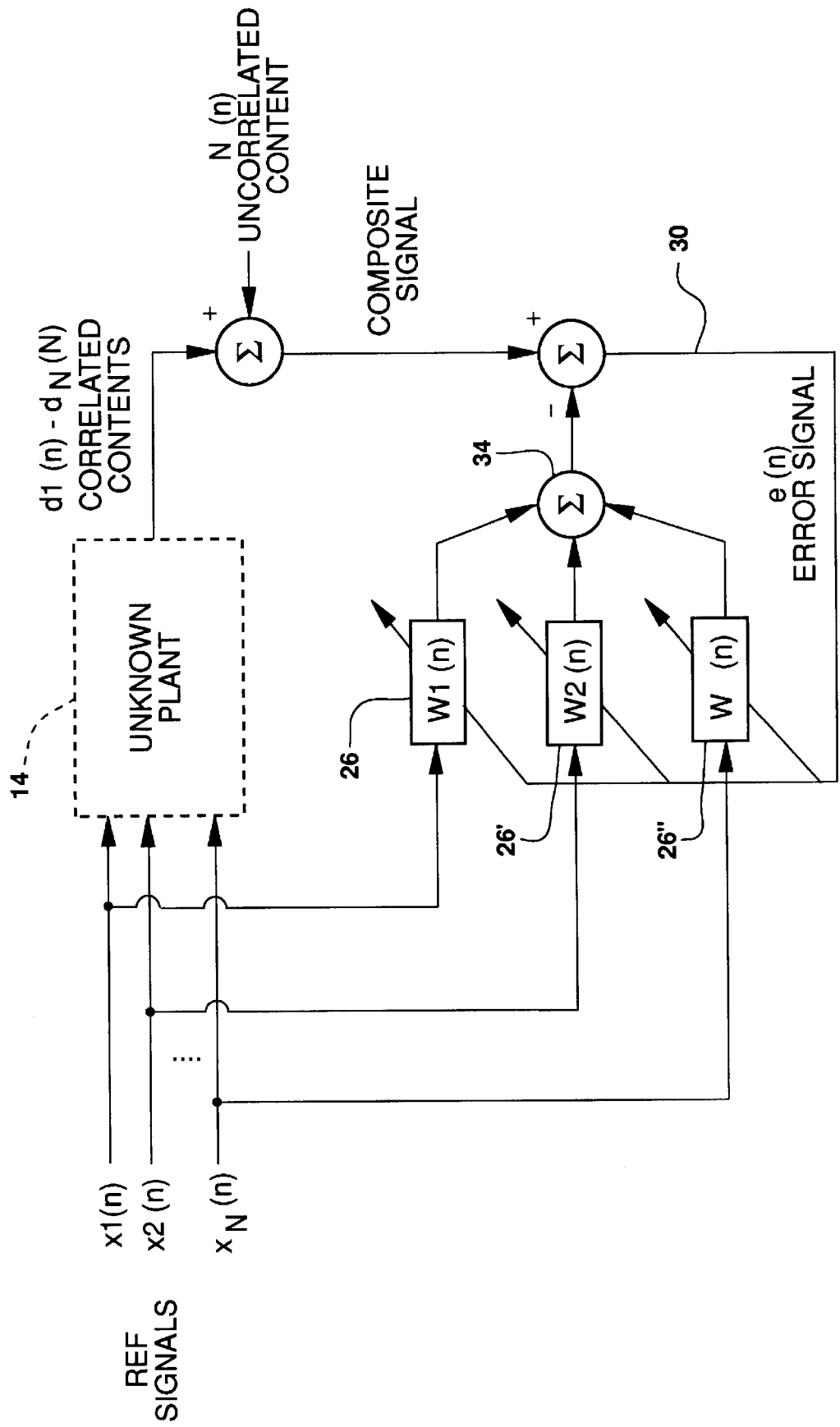
FIG. 4 is a block schematic diagram of the other embodiment of the present invention.

Referring to FIG. 4, multiple component signals are being observed by multiple sensors 16, 16', 16". The outputs of each of the adaptive filters 26, 26', 26" are added by a summer 34 prior to being subtracted from the composite signal at 36. The stability of this embodiment is defined by the following equation:

$$0 < \mu < \frac{1}{N(l+1)\sum_{m=1}^{N} E[x_m^2(n)]}. \quad (9)$$

Figure 5:
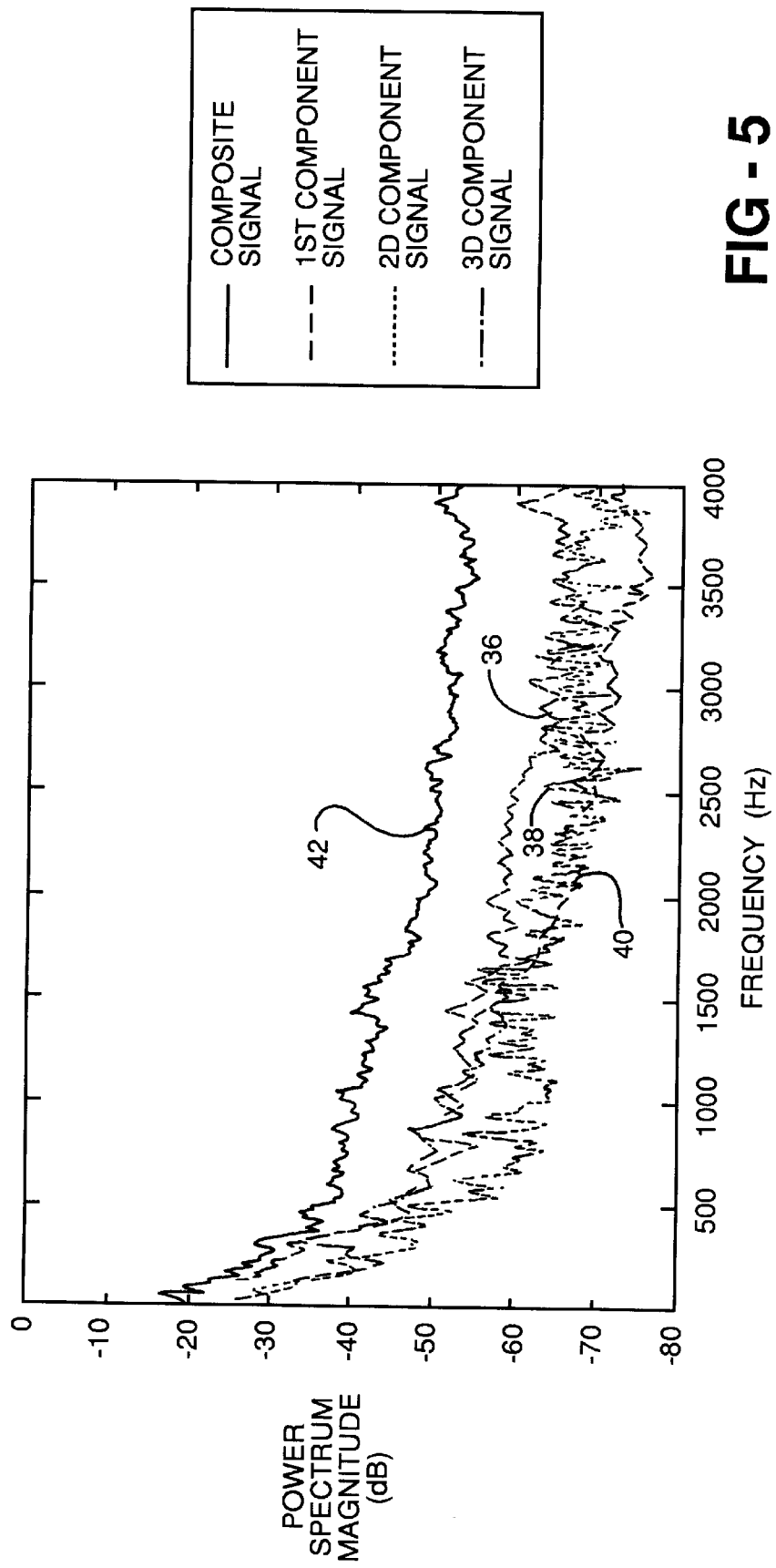
FIG. 5 is a graphic representation of the output of the other embodiment of the present invention.

Referring to FIG. 5, an output of the various signals is shown for a motor vehicle 14 operating at a speed of 30 miles per hour on a rough road. The extracting assembly 10 is capable of extracting three separate component signals 36,38,40 from the composite signal 42 and play them individually or in combination through the speaker 24. The difference between the component signals, whose power spectra are 36,38,40 and the composite signal, whose power spectrum is 42 is uncorrelated noise which is attributable to components not referenced by reference sensors 16, 16', 16".

The present invention has been described in an illustrative manner. It is to be understood that the terminology which has been used is intended to be in the nature of words of description rather than of limitation.

Many modifications and variations of the present invention are possible in light of the above teachings. Therefore, within the scope of the appended claims, the present invention may be practiced otherwise than as specifically described.

What is claimed is:

1. An extracting assembly for extracting a component signal generated by a component source from a composite signal of a motor vehicle, said extracting assembly comprising:

a separate reference sensor for generating a separate reference signal relating to activity of the component source;

a separate composite sensor for sensing the separate composite signal;

an adaptive filter operatively connected to said reference sensor and said composite sensor, said adaptive filter filtering the component signal from the composite signal as a function of the reference signal generated by said reference sensor, said adaptive filter utilizing a least-mean-square algorithm to adapt coefficients of said adaptive filter, said adaptive filter being adaptable by an adaptation step having an initial estimated size;

said adaptive filter being updated according to the equation:

$$\{W(n)\}=\{W(n-1)\}+2\,\mu e(n)\{X(n)\}$$

wherein $\mu$ is an adaptation coefficient used for speed of convergence and stability;

a performance feedback adaptor operatively connected to said adaptive filter and said composite sensor to generate an error signal which is the addition of the portion of the composite signal associated with the reference signal and the composite signal and the uncorrelated content of the composite signal, said error signal is calculated according to the equation: $e(n)=d(n)+N(n)-\{X(n)\}^T\{W(n-1)\}$ wherein $d(n)$ is a portion of the composite signal correlated to the activity of the component source;

a normalizer operatively connected to said adaptive filter for normalizing said predetermined size of said adaptation step of said adaptive filter and having a stability factor to generate the stability of said adaptive filter, said normalizer operates on said stability factor according to the equation:

$$\mu(n) = \frac{\mu_0}{\{X(n)\}^T\{X(n)\}}, \; \mu_0 < 1;$$

and an output port operatively connected to said adaptive filter for outputting all of the component signal filtered from the composite signal such that the component signal may be analyzed.

2. An extracting assembly as set forth in claim 1 wherein said composite sensor is a microphone.

3. An extracting assembly as set forth in claim 1 wherein said reference sensor is an accelerometer.

4. An extracting assembly as set forth in claim 1 including a speaker operatively connected to said adaptive filter for transforming said component signal into an audible signal.

5. A method for generating a composite signal and extracting a portion thereof generated by a predetermined source using a separate composite sensor and a separate reference sensor in a motor vehicle; the method comprising the steps of:

generating a reference signal from the reference sensor relating to activity of a component source;

generating a composite signal from the composite sensor;

transmitting the reference signal to an adaptive filter;

transmitting the composite signal to the adaptive filter;

outputting the portion of the composite signal based on the reference signal to be analyzed;

adapting the adaptive filter to remove the portion of the composite signal based on the reference signal by generating an error signal according to the equation: $e(n)=d(n)+N(n)-\{X(n)\}^T\{W(n-1)\}$ wherein $d(n)$ is a portion of the composite signal and minimizing the mean square of the error signal and updating the adaptive filter according to the equation:

$$\{W(n)\}=\{W(n-1)\}+2\,\mu e(n)\{X(n)\}$$

wherein $\mu$ is an adaptation coefficient used for speed of convergence and stability; and stabilizing the step of adapting the adaptive filter to minimize the step of adapting including normalizing the step size taken for each iteration of the adaptive filter by generating a normalization coefficient according to the equation:

$$\mu(n) = \frac{\mu_0}{\{X(n)\}^T\{X(n)\}}, \; \mu_0 < 1$$

6. An extracting assembly for extracting a component signal generated by a component source from a composite signal of a motor vehicle, said extracting assembly comprising:

at least one accelerometer for generating a reference signal relating to activity of the component source;

a microphone for sensing the composite signal;

an adaptive filter operatively connected to said at least one accelerometer and said microphone, said adaptive filter filtering the component signal from the composite signal as a function of the reference signal generated by said reference sensor, said adaptive filter utilizing a least-mean-square algorithm to adapt coefficients of said adaptive filter, said adaptive filter being adaptable by an adaptation step having an initial estimated size;

said adaptive filter being updated according to the equation:

$$\{W(n)\}=\{W(n-1)\}+2\,\mu e(n)\{X(n)\}$$

wherein $\mu$ is an adaptation coefficient used for speed of convergence and stability;

a performance feedback adaptor operatively connected to said adaptive filter and said microphone to generate an error signal which is the addition of the portion of the composite signal associated with the reference signal and the composite signal and the uncorrelated content of the composite signal, said error signal is calculated according to the equation: $e(n)=d(n)+N(n)-\{X(n)\}^T\{W(n-1)\}$ wherein $d(n)$ is a portion of the composite signal correlated to the activity of the component source;

a normalizer operatively connected to said adaptive filter for normalizing said predetermined size of said adaptation step of said adaptive filter and having a stability factor to generate the stability of said adaptive filter, said normalizer operates on said stability factor according to the equation:

$$\mu(n) = \frac{\mu_0}{\{X(n)\}^T\{X(n)\}}, \; \mu_0 < 1;$$

and an output port operatively connected to said adaptive filter for outputting all of the component signal filtered from the composite signal such that the component signal may be analyzed.

\* \* \* \* \*